United States Patent
Lee

(10) Patent No.: US 10,826,516 B2
(45) Date of Patent: Nov. 3, 2020

(54) GAIN CALIBRATION DEVICE AND METHOD FOR RESIDUE AMPLIFIER OF PIPELINE ANALOG TO DIGITAL CONVERTER

(71) Applicant: REALTEK SEMICONDUCTOR CORP., Hsinchu (TW)

(72) Inventor: Chi-Ying Lee, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/504,380

(22) Filed: Jul. 8, 2019

(65) Prior Publication Data

US 2020/0136633 A1    Apr. 30, 2020

(30) Foreign Application Priority Data

Oct. 26, 2018 (TW) .............................. 107138016 A

(51) Int. Cl.

| | |
|---|---|
| H03M 1/10 | (2006.01) |
| H03G 3/20 | (2006.01) |
| H03M 1/36 | (2006.01) |
| H03M 1/66 | (2006.01) |
| H03M 1/12 | (2006.01) |
| H03M 1/00 | (2006.01) |
| H03M 1/06 | (2006.01) |

(52) U.S. Cl.
CPC ............ *H03M 1/1038* (2013.01); *H03G 3/20* (2013.01); *H03M 1/1014* (2013.01); *H03M 1/121* (2013.01); *H03M 1/361* (2013.01); *H03M 1/66* (2013.01); *H03M 1/00* (2013.01); *H03M 1/001* (2013.01); *H03M 1/06* (2013.01); *H03M 1/1009* (2013.01); *H03M 1/12* (2013.01)

(58) Field of Classification Search
CPC ...... H03M 1/1009; H03M 1/06; H03M 1/001; H03M 1/00; H03M 1/12
USPC .......................... 341/120, 118, 110, 161, 155
See application file for complete search history.

(56) References Cited

U.S. PATENT DOCUMENTS

| | | | |
|---|---|---|---|
| 6,498,577 B1 | 12/2002 | Lin | |
| 9,325,336 B2 | 4/2016 | Mulder | |
| 9,438,260 B1 | 9/2016 | Ebata | |
| 2006/0279261 A1* | 12/2006 | Rees | ................ G01R 19/16542 322/62 |
| 2015/0236709 A1* | 8/2015 | Bouvier | ................ H03M 1/181 341/120 |

(Continued)

OTHER PUBLICATIONS

Keane, et al ., "Background Interstage Gain Calibration , Technique for Pipelined ADCs", IEEE Transactions on Circuits and Systems I: Regular Papers, vol. 52, No. 1, Jan. 2005.

*Primary Examiner* — Joseph J Lauture
(74) *Attorney, Agent, or Firm* — Li & Cai Intellectual Property (USA) Office

(57) ABSTRACT

A gain calibration device for an ADC residue amplifier includes a DAC and a flash ADC. The DAC is configured to convert the digital signal to an analog signal, and the DAC includes a calibration module used in the gain calibration of the ADC residual amplifier. The flash ADC is configured to generate a digital signal, the flash ADC includes a plurality of comparators, the total number of the plurality of comparators is equal to the number of output bits of the flash ADC, and the comparators are configured to be unevenly distributed in an input range.

18 Claims, 7 Drawing Sheets

(56) References Cited

U.S. PATENT DOCUMENTS

2016/0065230 A1* 3/2016 Mulder ............... H03M 1/1014
341/158

* cited by examiner

GAIN CALIBRATION DEVICE AND METHOD FOR RESIDUE AMPLIFIER OF PIPELINE ANALOG TO DIGITAL CONVERTER

CROSS-REFERENCE TO RELATED PATENT APPLICATION

This application claims the benefit of priority to Taiwan Patent Application No. 107138016, filed on Oct. 26, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to architecture of an analog to digital converter and a gain calibration device, and method for an analog to digital converter (ADC) residual amplifier.

BACKGROUND OF THE DISCLOSURE

Pipeline analog digital converters can include multiple analog digital converter stages, and each of the stages includes a sample-and-hold circuit, a flash analog digital converter (Flash ADC), a digital-analog converter, an adder, and a residue amplifier. The gain of the residue amplifier may be inaccurate and need correcting. The conventional pipeline analog digital converter adds a calibration signal in front of the DAC that is independent of the input signal but is related to the output of the residue amplifier to estimate the gain of the residual amplifier.

The flash ADC includes multiple comparators. Each comparator corresponds to a threshold voltage, and a voltage interval between threshold voltages of two adjacent comparators is referred to as a sub-range. Since the threshold voltage of the comparator is not completely accurate, over-range intervals are embedded above and below the sub-range to compensate for the offset of the threshold voltage of the comparator.

Although the over-range intervals are provided, however, if the input signal is close to an edge of the nominal sub-range, the input signal subtracted by the calibration signal may result in the input signal entering the over-range interval. The nonlinearity of the residue amplifier is higher in the over-range interval, thereby causing damage to the performance of the ADC. In addition, fewer over-ranges can be used to compensate for the offset of the comparator of the flash ADC, but more restrictions on the size of the wafer area and the power variation of the comparator will be imposed.

Therefore, providing a method to improve the output linearity of the residue amplifier through the improvement of the circuit design, while avoiding the problem associated with the over-ranges in the gain calibration process of the residue amplifier, has become one of the important issues in the art.

SUMMARY OF THE DISCLOSURE

In response to the above-referenced technical inadequacies, the present disclosure provides a gain calibration device and method for an analog to digital converter (ADC) residual amplifier.

In one aspect, the present disclosure provides a gain calibration device for an analog to digital converter (ADC) residual amplifier, and the gain calibration device includes a digital to analog converter (DAC) and a flash analog to digital converter (ADC). The DAC is configured to convert a digital signal to an analog signal. The flash ADC is configured to generate the digital signal and includes a plurality of comparators, and a number of the plurality of comparators is equal to a number of output bits of the flash ADC, and the plurality of comparators are uneven comparators providing a plurality of threshold voltages that are unevenly distributed in an input range.

In another aspect, the present disclosure provides a gain calibration method for an analog to digital converter (ADC) residue amplifier, including: configuring a flash analog to digital converter (ADC) to generate the digital signal, wherein the flash ADC includes a plurality of comparators, and a number of the plurality of comparators is equal to a number of output bits of the flash ADC; configuring the plurality of comparators to provide a plurality of threshold voltages in an input range, wherein the plurality of comparators are uneven comparators providing the plurality of threshold voltages that are unevenly distributed in the input range; configuring a digital to analog converter (DAC) to convert the digital signal to an analog signal; and configuring a calibration module of the DAC to perform a gain calibration for the ADC residue amplifier.

One of the beneficial effects of the present disclosure is that the nominal range output by the multiply DAC is smaller in a particular smaller sub-range, and the output signal has better linearity when the input signal falls within the sub-range.

Another beneficial effect of the present disclosure is that the gain calibration device and method for the DAC residue amplifier provided by the present disclosure can provide an uneven distribution of threshold voltages for gain calibration by setting a smaller sub-range, and it is possible to avoid reducing the dynamic range of the residual amplifier when performing the gain calibration.

Yet another advantageous effect of the present disclosure is that the gain calibration device and method for the ADC converter residue amplifier provided by the present disclosure can narrow down only a certain sub-range according to requirements, thereby avoiding unnecessary increase in the number of comparators.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
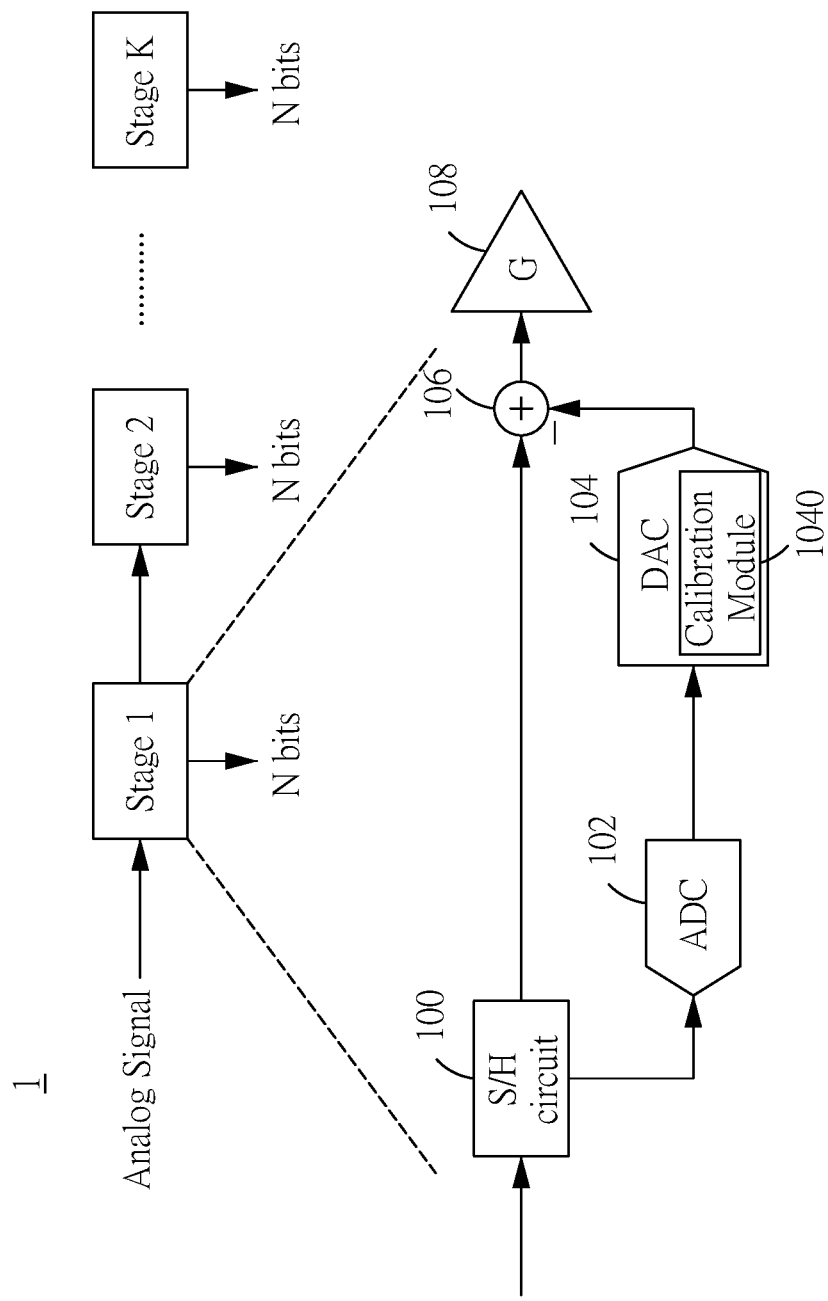
FIG. 1 is an architecture diagram of a pipeline ADC according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

The following is a description of an embodiment of the present disclosure relating to "a gain calibration device and method for an analog to digital converter (ADC) residue amplifier", by way of specific embodiment, those skilled in the art will be able to understand the advantages and effects of the present disclosure. The disclosure can be implemented or applied in various other specific embodiments, and various modifications and changes can be made without deviate the concept of the disclosure. In addition, the drawings of the present disclosure are merely illustrative and are not intended to be stated in the actual size. The following embodiment will further explain the related technical feature of the present disclosure, but the disclosure is not limited to the present disclosure.

Reference is now made to FIG. 1, which is an architecture diagram of a pipeline ADC according to an embodiment of the present disclosure. The embodiment of the present disclosure provides a pipeline analog digital converter 1 in which the circuit architecture of each stage is the same. The sub-circuits of each stage include: a sample-and-hold (S/H) circuit 100, a flash analog to digital converter (ADC) 102, a digital to analog converter (DAC) 104, a subtractor 106, and a residue amplifier 108. In the design of pipeline analog digital converter, the number of stages can be increased to reduce resolution requirements of each stage. Therefore, in each stage of the circuit, the allowable margin of error can be larger so that in the design of the comparator, the accuracy requirement can be greatly reduced, thereby reducing the power consumption of the comparator and the area of the chip.

When the input signal passes through the S/H circuit 100, the S/H circuit 100 samples the input signal to generate a sampling signal. The flash ADC 102 converts voltage values of the sampling signal held by the S/H circuit 100, generates a digital signal according to decrypted codes, and inputs the digital signal to the DAC 104. The DAC 104 is configured to convert the digital signal into an analog signal, and the sample signal held by the S/H circuit 100 is subtracted from the analog signal converted by the DAC 104 via the subtractor 106 to obtain a residue signal, which is amplified by the residue amplifier 108 and then sent to the next stage of circuit.

The flash ADC includes a comparator block that contains a plurality of comparators. In this case, the plurality of comparators are driven by a plurality of preamplifiers in a driver block, each comparator corresponds to a threshold voltage, and a voltage interval between the threshold voltages of the two adjacent comparators is referred to as a nominal sub-range. Since the threshold voltage of the comparator is not completely accurate, an over-range interval is provided on the upper and lower sides of the sub-range to compensate for the offset of the threshold voltage of the comparator. A specification of the voltage level of the output signal can be set, such that the output signal can remain in the nominal sub-range without entering the over-range. However, since the threshold voltages of the comparators are not accurate, the output signal may be shifted to the over-range interval below the nominal sub-range. For example, if the output signal is close to an edge of the nominal sub-range, the output signal subtracted by the calibration signal may result in the output signal of the residue amplifier entering the over-range interval. The non-linearity of the residue amplifier is higher in the over-range interval, thereby causing damage to the performance of the ADC. In addition, fewer over-ranges can be used to compensate for the offset of the comparator of the flash ADC, but more restrictions on the size of the wafer area and the power variation of the comparator will be imposed.

Figure 2:
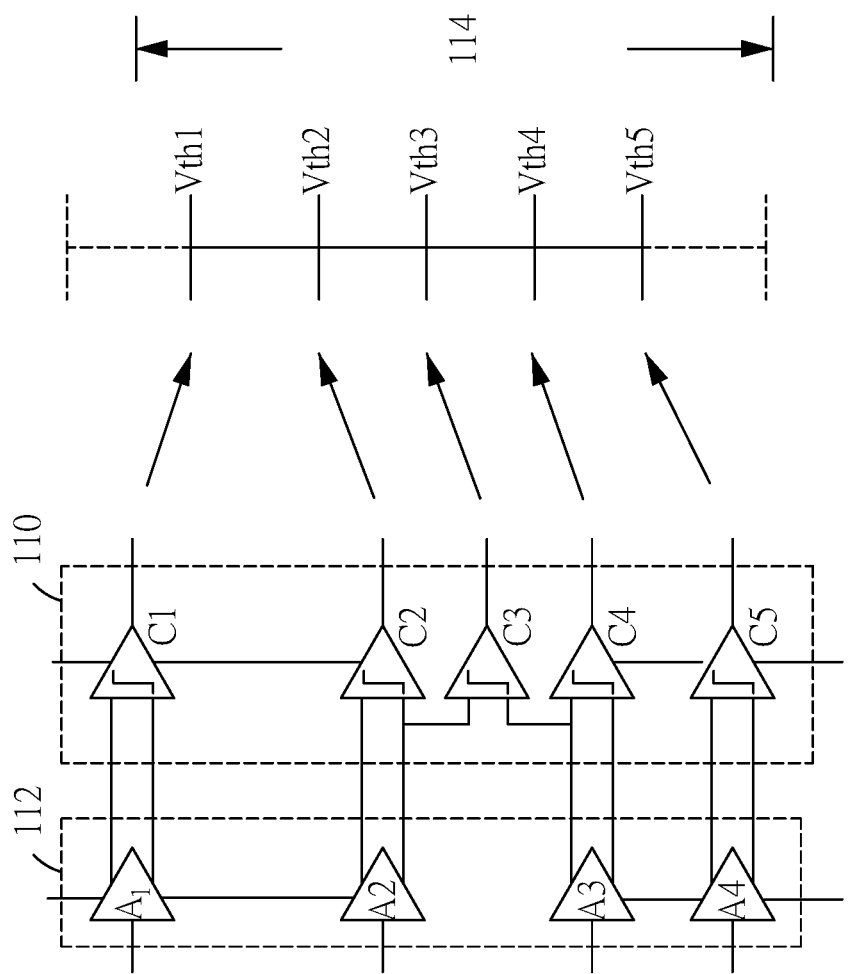
FIG. 2 is a circuit layout of a flash ADC according to the embodiment of the present disclosure.

Reference is now made to FIG. 2, which is a circuit layout of a flash ADC according to the embodiment of the present disclosure. As shown in FIG. 2, the flash ADC 102 of the present disclosure includes a comparator block 110. The flash ADC 102 is used to generate digital signals for the DAC 104, and the comparator block 110 includes multiple comparators, such as comparators C1, C2, C3, C4, and C5. In some embodiments, the flash ADC 102 of the present disclosure can include a driver block 112, which is driven by multiple preamplifiers A1, A2, A3 and A4 of the driver block 112. The preamplifiers are used to amplify the difference between the input signal and the reference voltage, and the difference of the analog signals are then extended by the comparators in the rear stage into distinctly high and low level digital signals, however, the driver block 112 is not necessary to be included. The comparator C1, C2, C3, C4 and C5 respectively correspond to threshold voltages Vth1, Vth2, Vth3, Vth4 and Vth5, and an interval between threshold voltages Vth1 and Vth5 is a sub-range 114. In this case, the plurality of comparators C1, C2, C3, C4 and C5 are uneven comparators, which provide unevenly distributed threshold voltages within the input range, and a total number of the plurality of comparators is equal to a number of output bits of the flash ADC.

In more detail, the range of the threshold voltages Vth1 to Vth5 provided by the comparators C1 to C5 can be used for gain calibration. In a 2-bit sub-circuit, for the residue amplifier 108 with a gain of 2, the voltage interval is Vref for the total sub-ranges, which prevents the dynamic range of the residual amplifier 108 from being reduced during the gain calibration.

Figure 3:
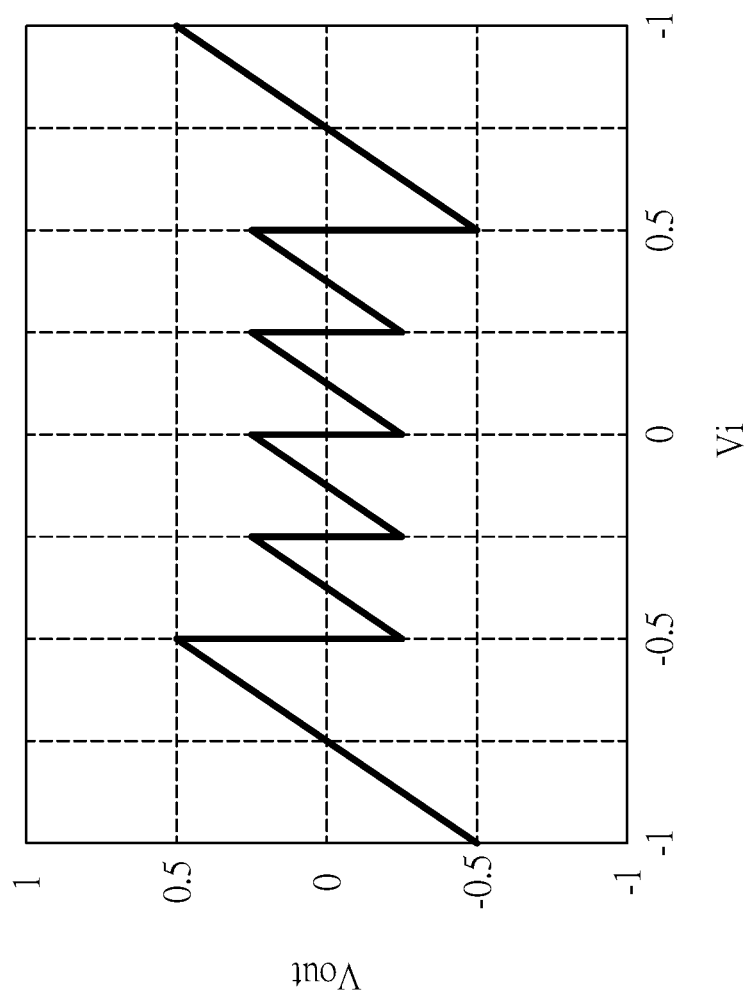
FIG. 3 is an input/output transferring graph of a single stage sub-circuit according to the embodiment of the present disclosure.

In detail, for the flash ADC 102, additional comparators in certain sub-ranges can be provided according to requirements, thus avoiding unnecessary increases in the number of comparators. Generally, taking an OFDM system as example, the signal is concentrated near the input voltage of 0, therefore, the comparators can be considered to be concentratedly provided in an interval near an input voltage of 0. In other words, the nominal sub-range 114 can include the voltage zero point, and preferably, the threshold voltages Vth1, Vth2, Vth3, Vth4 and Vth5 can be −0.5 Vref, −0.25 Vref, 0, 0.25 Vref and 0.5 Vref, respectively. FIG. 3 shows an input/output transferring graph of a single stage sub-circuit according to the embodiment of the present disclosure.

Figure 4:
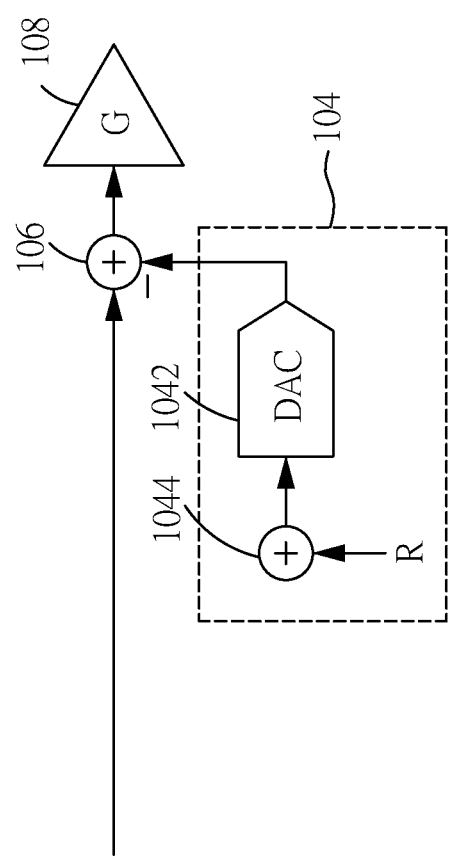
FIG. 4 is an architecture diagram of a DAC according to the embodiment of the present disclosure.
Figure 5:
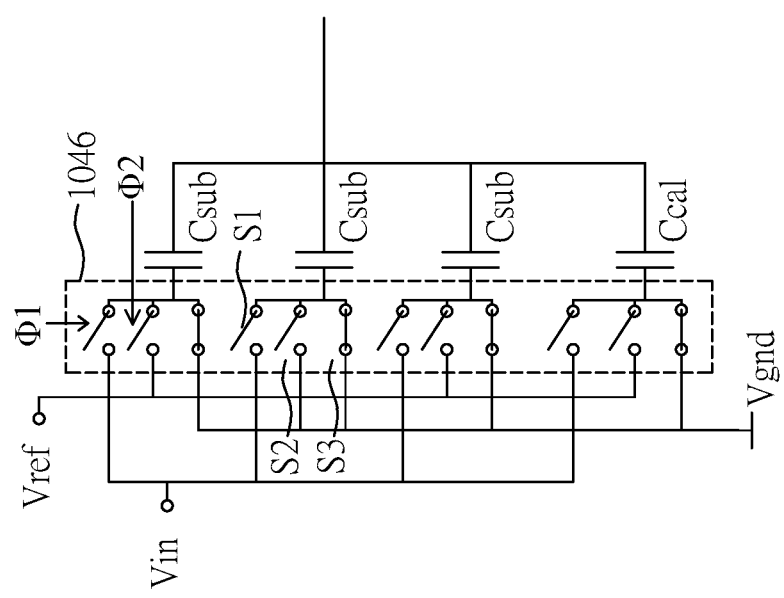
FIG. 5 is a circuit layout of a DAC according to the embodiment of the present disclosure.

Reference is now made to FIGS. 4 and 5. FIG. 4 is an architecture diagram of a DAC according to the embodiment of the present disclosure, and FIG. 5 is a circuit layout of a DAC according to the embodiment of the present disclosure. As shown in the figures, the DAC 104 and a calibration module 1040 thereof can be implemented by a multiply DAC, and the calibration module 1040 can be used for a background calibration, which is performed by inputting a calibration signal R to the DAC via an adder 1044. The input of the calibration signal R is controlled by a pseudo-random noise sequence, and when amplitude of the input signal is within the sub-range 114, the input of the calibration signal R is allowed.

In the present embodiment, the DAC 104 is a multiply DAC (MDAC) that can accept an external reference signal (e.g., Vref). The DAC 104 can be a switch capacitor MDAC including a switch block 1046 that can operate on two phases Φ1 and Φ2 of a clock signal and a sub-range capacitor Csub.

In the present embodiment, a switch S1 is turned on, and switches S2 and S3 are turned off in a first phase Φ1 of the clock signal, such that the sub-range capacitor Csub is charged by the input signal Vin. In a second phase Φ2 of the clock signal, the switch S1 is turned off, and the switch S2 or S3 is turned on, and the charge on the sub-range capacitor Csub is transferred to the next stage of the circuit.

In addition, the calibration module 1040 includes a calibration capacitor Ccal as shown in the figures, which forms a calibration loop for an analog calibration of the gain error of the residue amplifier 108. The calibration of the gain error of the residue amplifier 108 is of importance in increasing the power efficiency of the residue amplifier 108. The calibration signal can be injected into the calibration capacitor Ccal by coupling the calibration capacitor Ccal to the reference voltage Vref with a switch of the switch block 1046. In one or more examples, the injection of the calibration signal can be controlled by a pseudo-random noise sequence. In order to accurately perform the gain calibration and speed up the operation of the calibration loop, a relatively large value can be selected for the capacitance of the calibration capacitor Ccal. The appropriate value of the capacitance of the calibration capacitor Ccal may be one-half of the capacitance of the sub-range capacitor Csub, and the sub-range capacitance Csub matches the size of the above-described nominal sub-range, that is, 0.5 times the reference voltage Vref.

Figure 6:
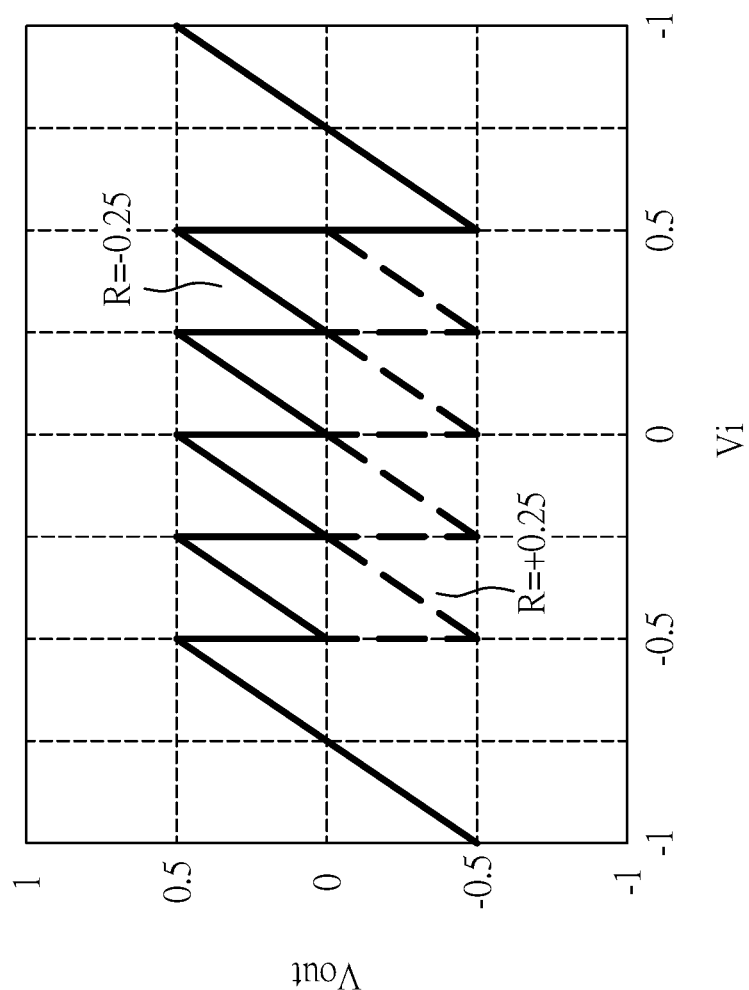
FIG. 6 is an input/output transferring graph showing a calibration signal injected by a signal stage sub-circuit according to the embodiment of the present disclosure.

Reference is now made to FIG. 6, which is an input/output transferring graph showing a calibration signal injected by a signal stage sub-circuit according to the embodiment of the present disclosure. Similarly, the details of the gain calibration for the residue amplifier 108 are illustrated in a 2-bit sub-circuit with a gain of 2 in the residue amplifier 108. When the comparator determines that the signal falls within the sub-range 114, a calibration signal R={−0.25, +0.25} is injected in front of the DAC 1042. The input-output transfer graph is further changed from FIG. 3 to FIG. 6, where the over-range shifted by the comparator is still 0.5 Vref. In other words, the calibration can be performed when the input signal Vi falls within the interval [−0.5 Vref, 0.5 Vref].

The gain calibration method for the analog to digital converter residue amplifier of the present disclosure will be described in detail below with reference to the accompanying drawings. In the present embodiment, the gain calibration method for the analog to digital converter residue amplifier can be applied to the foregoing embodiment, but is not limited thereto. The method provided by the present embodiment may also be implemented in any of the embodiments described above in various manners as conceivable by those skilled in the art.

Figure 7:
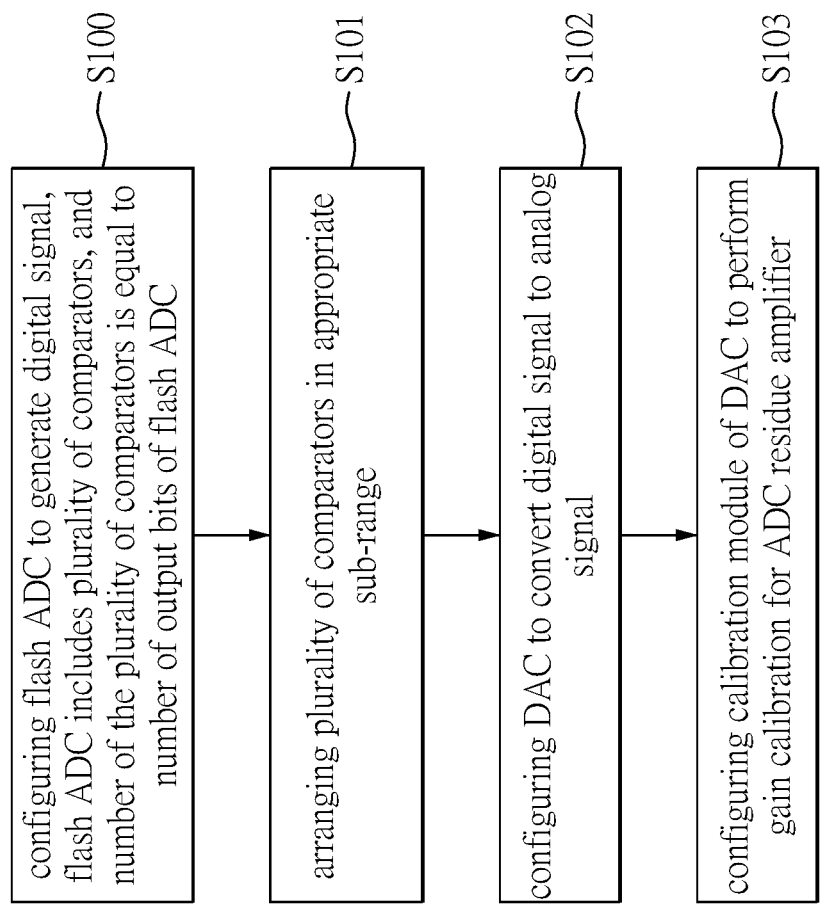
FIG. 7 is a flowchart of a gain calibration method for an ADC residue amplifier according to the embodiment of the present disclosure.

Reference is now made to FIG. 7, which is a flowchart of a gain calibration method for an ADC residue amplifier according to the embodiment of the present disclosure. As shown in FIG. 7, the gain calibration method for an ADC residue amplifier according to the present embodiment includes the following steps:

Step S100: configuring a flash ADC to generate the digital signal, the flash ADC includes a plurality of comparators, and a number of the plurality of comparators is equal to a number of output bits of the flash ADC.

Step S102: arranging a plurality of comparators in the appropriate sub-range. As described in the foregoing embodiment, the gain correction is performed when the input signal falls within the sub-range.

Step S103: configuring a digital to analog converter (DAC) to convert the digital signal to an analog signal.

Step S104: configuring a calibration module of the DAC to perform a gain calibration for the ADC residue amplifier, thereby preventing the dynamic range of the residual amplifier from being reduced during the gain calibration.

Furthermore, additional comparators can be provided in certain sub-ranges according to practical requirements. For example, when applied to an OFDM system, the signal is concentrated near the input voltage of 0, therefore, the comparators can be considered to be concentratedly provided in an interval near an input voltage of 0. In other words, the sub-range can include the voltage zero point, thereby avoiding unnecessary increase in the number of comparators.

Advantageous Effects of Embodiments

One beneficial effect of the present disclosure is that the gain calibration device and method for the DAC residue amplifier provided by the present disclosure can provide an uneven distribution of threshold voltages in the input range, so as to select a smaller sub-range for the gain correction, and it is possible to avoid reducing the dynamic range of the residual amplifier when performing the gain calibration. The nominal range output by the multiply DAC is smaller in a particular smaller sub-range, and the output signal has better linearity when the input signal falls within the sub-range.

Another advantageous effect of the present disclosure is that the gain calibration device and method for the ADC residue amplifier provided by the present disclosure can narrow down specific sub-ranges according to requirements, thereby avoiding unnecessary increase in the number of comparators.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A gain calibration device for an analog to digital converter (ADC) residual amplifier, the gain calibration device comprising:
a digital to analog converter (DAC) configured to convert a digital signal to an analog signal, wherein the DAC includes a calibration module used in a gain calibration of the ADC residue amplifier; and
a flash analog to digital converter (ADC) configured to generate the digital signal and including a plurality of comparators,
wherein a number of the plurality of comparators is equal to a number of output bits of the flash ADC, and wherein the plurality of comparators provides a plurality of threshold voltages that are unevenly distributed in an input range,
wherein the input range includes a zero point voltage of the input signal.

2. The gain calibration device according to claim 1, wherein the flash ADC is configured to generate the digital signal by digitally converting a sampling signal of an input signal.

3. The gain calibration device according to claim 2, further including a part of a stage of a pipeline analog-digital converter (ADC), wherein the pipeline ADC includes the ADC residue amplifier configured to amplify a residue signal.

4. The gain calibration device according to claim 3, wherein the residue signal is generated by subtracting the analog signal from the sampling signal of the input signal.

5. The gain calibration device according to claim 1, wherein the DAC includes a multiply digital to analog converter, wherein the calibration module includes a calibration capacitor configured to be charged with a reference voltage in a calibration interval.

6. The gain calibration device according to claim 5, wherein the calibration capacitor is configured to be charged to an electric potential equal to ½ of the input range, and wherein the threshold voltages provided by the uneven comparator is set to avoid a negative effect of a calibration signal in a dynamic range of the residue amplifier.

7. The gain calibration device according to claim 1, wherein the gain calibration of the ADC residue amplifier includes a background calibration, and wherein the background calibration is performed by inputting a calibration signal to the DAC.

8. The gain calibration device according to claim 7, wherein the input of the calibration signal is controlled by a pseudo-random noise sequence.

9. The gain calibration device according to claim 8, wherein an input of the calibration signal is allowed when amplitude of the input signal is located in the input range.

10. A gain calibration method for an analog to digital converter (ADC) residue amplifier, comprising:
configuring a flash analog to digital converter (ADC) to generate a digital signal, wherein the flash ADC includes a plurality of comparators, and a number of the plurality of comparators is equal to a number of output bits of the flash ADC;
configuring the plurality of comparators to provide a plurality of threshold voltages in an input range, wherein the plurality of comparators provides the plurality of threshold voltages that are unevenly distributed in the input range;
configuring a digital to analog converter (DAC) to convert the digital signal to an analog signal; and
configuring a calibration module of the DAC to perform a gain calibration for the ADC residue amplifier, wherein the input range includes a zero point voltage of the input signal.

11. The gain calibration method according to claim 10, wherein the flash ADC is configured to generate the digital signal by digitally converting a sampling signal of an input signal.

12. The gain calibration method according to claim 11, further including a part of a stage of a pipeline analog-digital converter (ADC), wherein the pipeline ADC includes the ADC residue amplifier configured to amplify a residue signal.

13. The gain calibration method according to claim 12, wherein the residue signal is generated by subtracting the analog signal from the sampling signal of the input signal.

14. The gain calibration method according to claim 10, wherein the DAC includes a multiply digital to analog converter, and wherein the calibration module includes a calibration capacitor configured to be charged with a reference voltage in a calibration interval.

15. The gain calibration method according to claim 14, wherein the calibration capacitor is configured to be charged to an electric potential equal to ½ of the input range, and wherein the threshold voltages provided by the uneven comparator is set to avoid a negative effect of a calibration signal in a dynamic range of the residue amplifier.

16. The gain calibration method according to claim 10, wherein the gain calibration of the ADC residue amplifier includes a background calibration, and wherein the background calibration is performed by inputting a calibration signal to the DAC.

17. The gain calibration method according to claim 16, wherein the input of the calibration signal is controlled by a pseudo-random noise sequence.

18. The gain calibration method according to claim 16, wherein an input of the calibration signal is allowed when amplitude of the input signal is within the input range.

* * * * *